United States Patent [19]
Chung

[11] Patent Number: 5,477,556
[45] Date of Patent: Dec. 19, 1995

[54] HIGH POWER LASER DIODE DRIVER UTILIZING A MONOLITHIC SEMICONDUCTOR DEVICE WITH A THYRISTOR-LIKE STRUCTURED SWITCH

[76] Inventor: Hyung D. Chung, 1-601 Jam Won Family Apt., Jam Won Dong, Seocho Ku, Seoul, Rep. of Korea

[21] Appl. No.: 284,299

[22] Filed: Aug. 2, 1994

[30] Foreign Application Priority Data

Apr. 18, 1994 [KR] Rep. of Korea .................. 94-8104

[51] Int. Cl.⁶ ..................................................... H01S 3/00
[52] U.S. Cl. ................... 372/38; 372/29; 327/438
[58] Field of Search ....................... 372/29, 38; 307/631

[56] References Cited

U.S. PATENT DOCUMENTS 5,331,234   7/1994   Merritt ................................ 307/631

*Primary Examiner*—Leon Scott, Jr.
*Attorney, Agent, or Firm*—Nolte, Nolte & Hunter

[57] ABSTRACT

A laser diode driver utilizing a monolithic semiconductor device an energy storage capacitor and an optically activated, thyristor-like structured $p^+$-n-i-p-$n^+$ semiconductor switch integrated onto a single substrate, capable of achieving high reliability, high efficiency, and high pulse repetition frequency.

1 Claim, 5 Drawing Sheets

Pulse Biased Voltage

Triggering Optical Pulse

Output Laser Pulse

HIGH POWER LASER DIODE DRIVER UTILIZING A MONOLITHIC SEMICONDUCTOR DEVICE WITH A THYRISTOR-LIKE STRUCTURED SWITCH

BACKGROUND OF THE INVENTION

1. Field of the Invention

The present invention relates to a laser diode driver, and more particularly to a laser diode driver utilizing a monolithic semiconductor device with a thyristor-like structured switch.

2. Description of the Prior Art

We have already proposed a high power, high pulse repetition frequency (PRF), compact, pulsed laser diode driver utilizing a monolithic semiconductor device in the pending U.S. patent application Ser. No. 08/247,064, allowed Feb. 7, 1995. Such a monolithic semiconductor device, in which the energy storage capacitor and the optically activated semiconductor switch are integrated onto a single high resistance semiconductor wafer substrate, is used to minimize the stray inductance and stray capacitance effects. The result is a pulsed, high power laser driver capable of fast turn on and turn off times and high PRF.

In an ideal operating condition, the output laser pulse width is determined by the two-way wave transit time in the energy storage non-uniform impedance stripline. In addition, the non-uniform impedance stripline induces current gain. Therefore, utilization of the non-uniform impedance stripline structure as the energy storage capacitor and the optically activated semiconductor switches as a switch is very effective way for the generation of the high peak power, high PRF, laser pulses with extremely narrow pulsewidth.

However, operation of this device depends on an optically activated semiconductor switch, in which it requires triggering optical energy to turn on the switch. In general, as the power capability of the ordinary optically activated switch increases, the required triggering optical energy level goes up rapidly. As a result, the capability and performance of the triggering laser driver, depending on the optically activated device, degraded rapidly.

SUMMARY OF THE INVENTION

Therefore, an object of the invention is to provide a high power, pulsed laser diode driver utilizing a monolithic semiconductor device with a thyristor-like structured switch, capable of achieving high reliability, high efficiency, and high PRF.

In accordance with the present invention, this object can be accomplished by providing a laser diode driver comprising an energy storage capacitor and an optically activated semiconductor switch integrated onto a single substrate, wherein the optically activated semiconductor switch has a thyristor-like structure.

BRIEF DESCRIPTION OF THE DRAWINGS

Other objects and aspects of the invention will become apparent from the following description of embodiments with reference to the accompanying drawings in which:

FIGS. 2a and 2b illustrate an optically activated monolithic semiconductor device consisting of an energy storage medium and an optically activated vertical semiconductor switch in accordance with the present invention, wherein FIG. 2a is a plan view of the monolithic semiconductor device, and FIG. 2b is a cross-sectional view taken along the line A—A of FIG. 2a;

FIGS. 2c and 2d illustrate another optically activated monolithic semiconductor device consisting of an energy storage medium and an optically activated lateral semiconductor switch in accordance with the present invention, wherein FIG. 2c is a plan view of the monolithic semiconductor device, and FIG. 2d is a cross-sectional view taken along the line A—A of FIG. 2c;

FIGS. 3a to 3c illustrate the semiconductor switch of the optically activated monolithic semiconductor device in accordance with the present invention, wherein FIG. 3a is a plan view of the semiconductor switch having a $p^+$-n-i-p-$n^+$ structure, FIG. 3b is an energy-band diagram of the semiconductor switch at equilibrium condition, and FIG. 3c is an energy-band diagram of the semiconductor switch at forward biased condition.

DETAILED DESCRIPTION OF THE PREFERRED EMBODIMENTS

Figure 1:
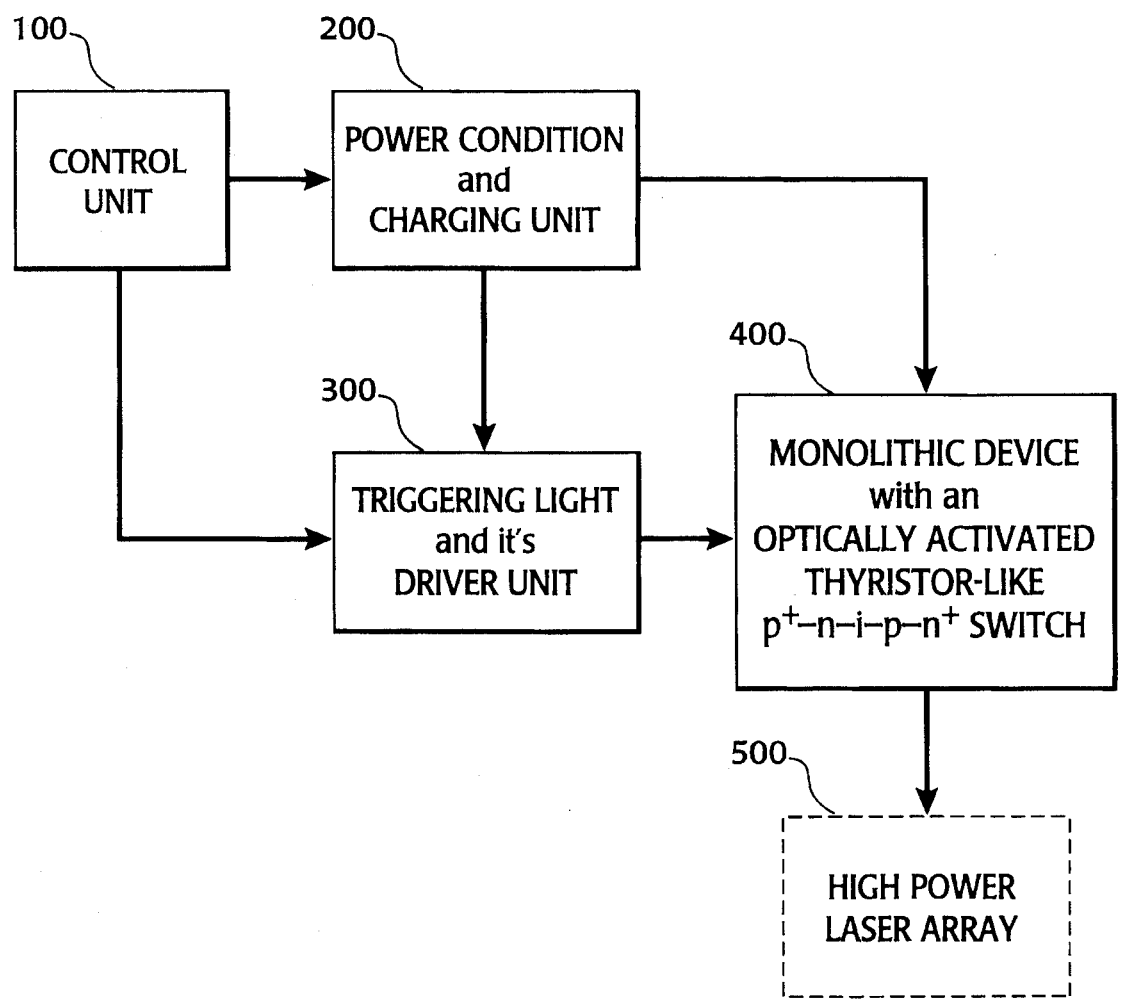
FIG. 1 is a block diagram of a laser diode driver in accordance with the present invention.

FIG. 1 is a block diagram of a high power, pulsed laser diode driver to which the present invention is applied. As shown in FIG. 1, the pulsed laser diode driver comprises a control unit 100, an electric power conditioning and pulse charging unit 200, a triggering light source and drive unit 300, an optically activated monolithic semiconductor unit 400, and a high power laser array 500.

The control unit 100 controls a signal introduced from an input stage and sends the controlled signal to the electric power conditioning and pulse charging unit 200. The control unit 100 also applies a signal to the triggering light source and drive unit 300.

The electric power conditioning and pulse charging unit 200 conditions the prime electrical energy derived from either AC power line or battery by the signal from the control unit 100 and then sends certain energy to the triggering light source and drive unit 300. The electric power conditioning and pulse charging unit 200 also sends certain energy to the optically activated monolithic semiconductor unit 400.

The triggering light source and drive unit 300 serves to trigger the prime electrical energy received from the electric power conditioning and pulse charging unit 200 and thereby output optical laser light of low or middle power at the monolithic semiconductor unit 400.

The monolithic semiconductor unit 400 is consisted of an energy storage medium for storing electrical energy therein and an optically activated semiconductor switch for converting the capacitively charged electrostatic energy into the high current impulse while being turned on by the laser light received from the triggering light source and drive unit 300.

The energy storage medium and the semiconductor switch are integrated onto a single semiconductor substrate. The optically activated semiconductor switch is constituted by a thyristor-like structured $p^+$-n-i-p-$n^+$ switch. This switch serves to convert the capacitively charged electrostatic energy into the high current impulse while performing its switching operation by the laser light received from the triggering light source and drive unit 300.

The high power laser array 500 outputs the high current impulse converted in the optically activated monolithic semiconductor unit 400 in the form of high power, optical pulse.

By signal from the control unit 100, the prime electrical energy, derived from either AC power line or battery, is conditioned and then used to capacitively charging the energy storage medium, such as capacitor, of the monolithic semiconductor device 400. As the optical light from the triggering optical source and drive unit 300 introduced into the optically activated switch, the capacitively charged electrostatic energy converts into the high current impulse to be sent to the high power laser array 500. As a result, the high power laser array 500 outputs the high power, optical pulse.

In accordance with the present invention, the pulsed laser diode driver employs monolithic semiconductor devices, respectively shown in FIGS. 2a and 2b, and FIGS. 2c and 2d, in which they combine the functions of the energy storage capacitor and the optically activated switch onto a single semiconductor substrate.

Each of the monolithic semiconductor devices includes a separate matching impedance which is then connected to the high power laser array 500.

Figure 2A:
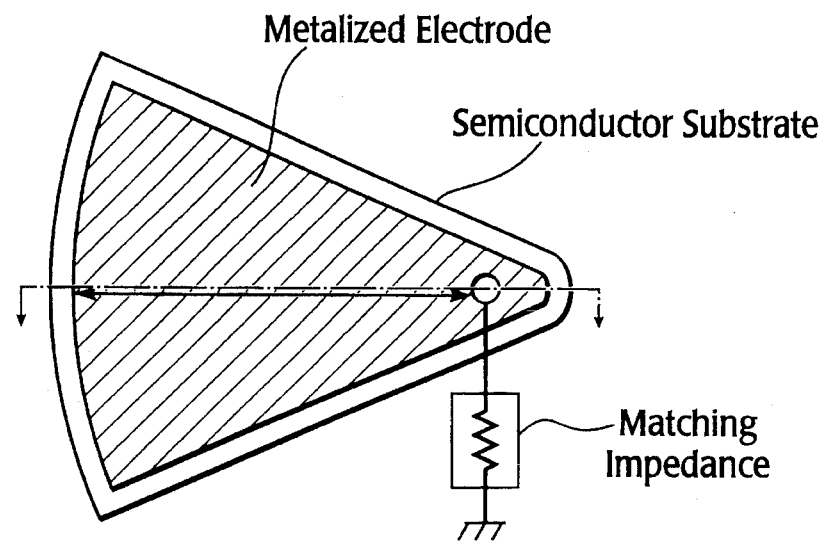
Figure 2B:
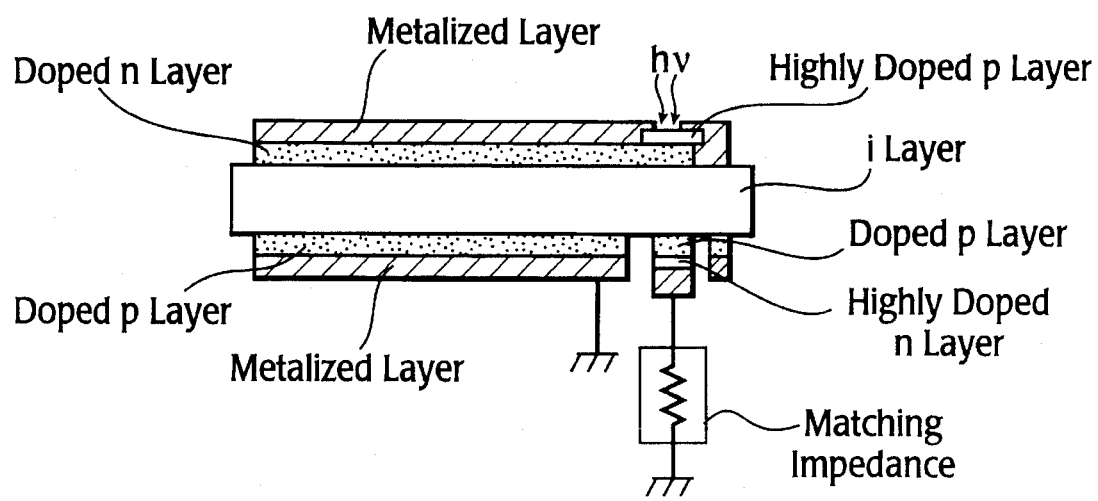
Figure 2C:
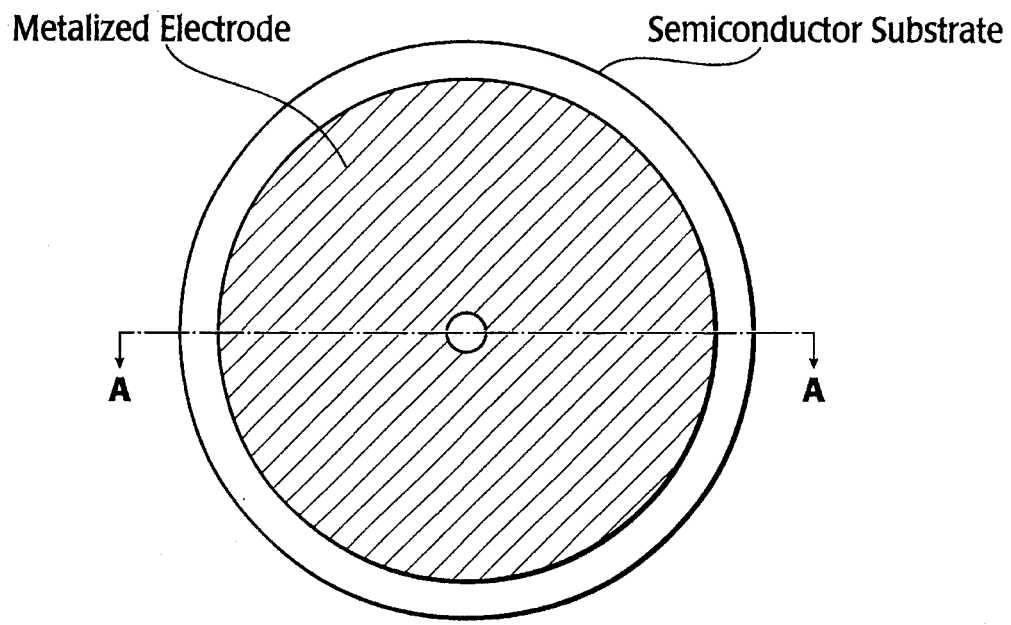
Figure 2D:
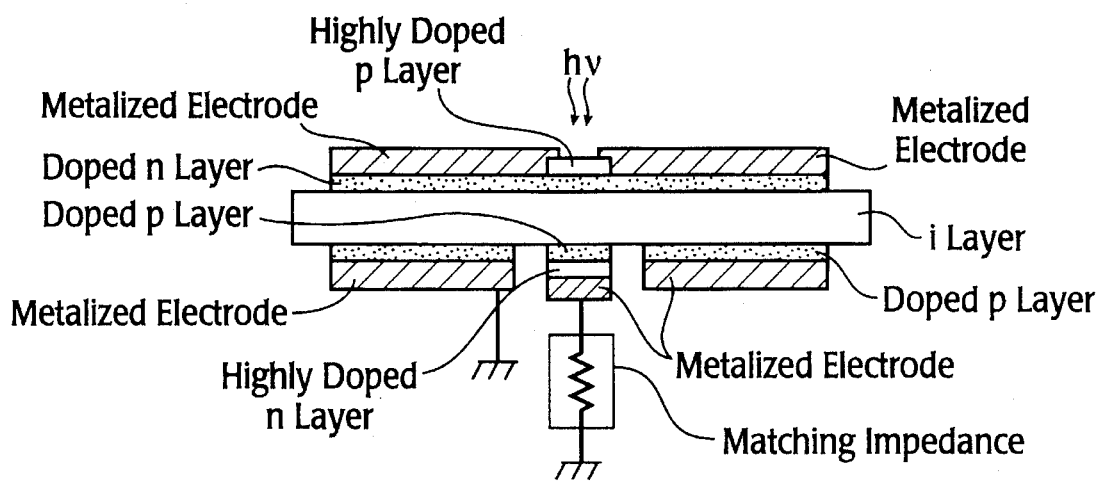

The optically activated monolithic device consists of energy storage medium and vertical semiconductor switch having a fan shaped non-uniform stripline structure shown in FIGS. 2a and 2b or a concentric strip shaped non-uniform stripline structure shown in FIGS. 2c and 2d. In particular, the vertical switch structure allows extension of the geometry of a monolithic device incorporating vertical switch structure into a complete circular shape.

The energy storage capacitor is fabricated by metallizing electrodes 2 on both sides of the semiconductor substrate 1. The energy storage capacitor has an n-i-p structure. The capacitance of the monolithic energy storage capacitor and stored electrostatic energy in this capacitor are given as following:

$$C = \epsilon_o \times \epsilon_r \times A/d, \text{ Farad } (F)$$

$$E + C \times V^2/2, \text{ Joule } (J)$$

where $\epsilon_o$ is the permittivity of the material, $\epsilon_r$ is the dielectric constant of the dielectric material, A is the area of the electrode, d is the thickness of the device, and V is the pulse biased voltage, respectively. The expected output laser pulse width from this monolithic device can be expressed by the following equation:

$$PW = 2 \times t = \{2 \times \sqrt{\epsilon_r} \times L(cm)\}/\{3 \times 10^{10} (cm/s)\}, (s)$$

where t is the two-way wave transit time in the energy storage medium and L is the electrode length between inner and outer edges of the energy storage medium.

Figure 3A:
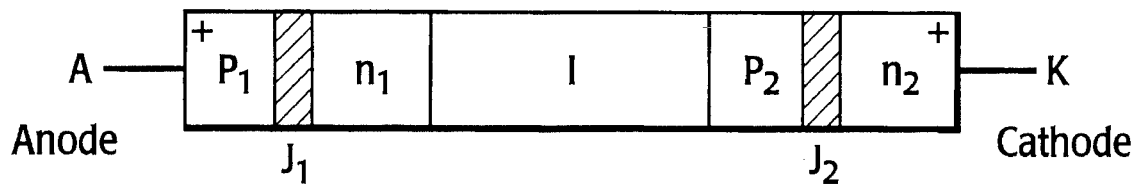
Figure 3B:
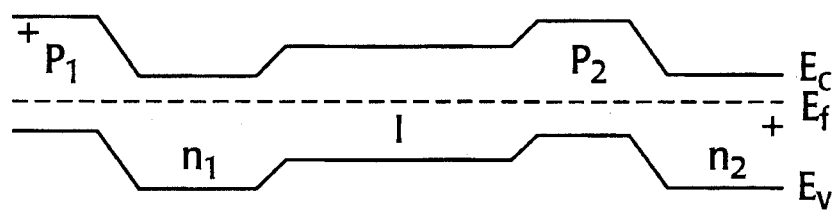

FIG. 3a shows the thyristor-like semiconductor switch of the monolithic semiconductor device in accordance with the present invention. The semiconductor switch has a $p^+$-n-i-p-$n^+$ structure. The energy-band diagram of the thyristor-like semiconductor switch at equilibrium condition is given in FIG. 3b. On the other hand, FIG. 3c shows the energy-band diagram of the thyristor-like semiconductor switch under the normal forward biased operation condition.

Figure 3C:
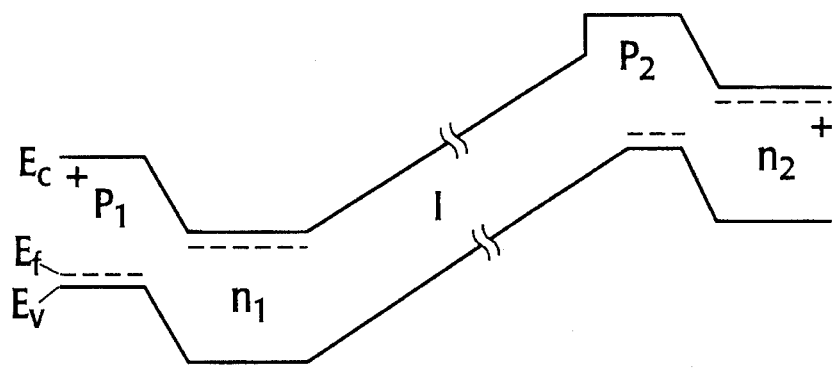

As shown in FIG. 3c, under the normal forward biased operation condition, junctions J1, created by the highly doped $p1^+$ and n1 layers, and J3, created by the highly doped p2 and $n2^+$ layers, become forward biased p-n junctions. Thus, the most of the biased voltage drops across the center n-i-p diode. Therefore, during the pulse biasing period, the region, n1-i-p2 (n-i-p diode), acts as a blocking diode.

When the triggering light pulse is introduced into this thyristor-like $p^+$-n-i-p-$n^+$ structured switch, electron-hole pairs are generated at the inside blocking n-i-p diode. These photon-generated electron-hole pairs will be separated by the electric field, giving rise to a photocurrent. The photocurrent instantly increases the conductivity of the i region so that the voltage across the i layer is drastically reduced and is transferred to the $p1^+$-n1 and p2-$n2^+$ junctions. The carrier injection from the $p1^+$-n1 and p2-$n^+$ junctions helps the turn-on of the switch.

The action of the driver starts by forwarding the operating instruction to the control unit 100 which initiates sequence of actions. At first the electric power conditioning and pulse charging unit 200 is activated. The prime power from either AC power line or battery is conditioned and used to pulse charging the capacitor which is the energy storage medium, namely, the energy storage capacitor, of the optically activated monolithic semiconductor unit 400.

At the time the pulse biasing voltage is reached the peak voltage, the driver circuit for the triggering laser diode of the triggering light source and drive unit 300 generates a fast rise time triggering optical pulse at very high PRF. The generated triggering optical pulse is introduced into the thyristor-like $p^+$-n-i-p-$n^+$ switch of the monolithic semiconductor unit 400. Once a triggering optical light with proper wavelength as well as enough optical power is penetrated into the active area of the thyristor-like $p^+$-n-i-p-$n^+$ switch on the monolithic semiconductor unit 400, it produces sufficient numbers of the photon-generated electron-hole pairs, initiates switch switching and results in a completely closing (conducting)switch state.

With the switch turn-on, the boundary condition at the inner electrode of the pulse biased monolithic device is changed from high impedance (open state) to highly conductive (close state). As the boundary condition at the inner electrode becomes highly conductive, the electrostatic energy stored in the monolithic semiconductor unit 400 becomes traveling wave, starts to flow through the switch, and delivers to the high power laser array 500 as a form of high current impulse. As a result, the high power laser array 500 outputs laser pulses having the pulse width PW (PW= $2 \times t = \{2 \times \sqrt{\epsilon_r} \times L(cm)\}/\{3 \times 10^{10} (cm/s)\}$,(s).

Figure 4A:
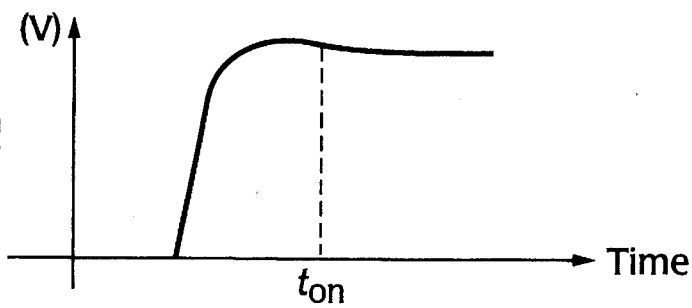
FIGS. 4a to 4c are waveform diagrams respectively illustrating the graphical sequences of the energy flow of the laser diode driver in accordance with the present invention.
Figure 4B:
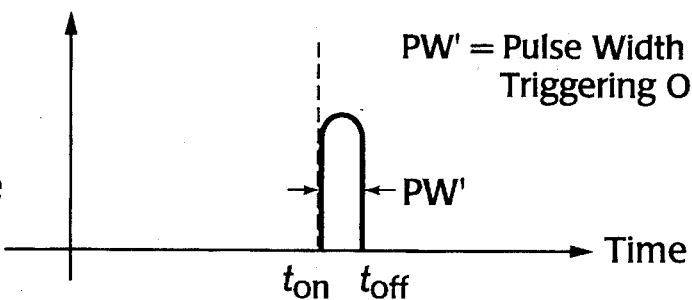
Figure 4C:
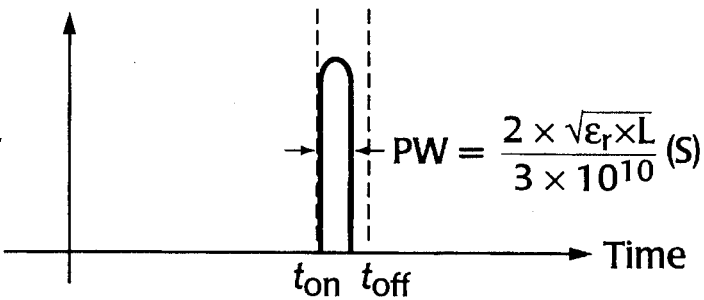

The sequential events of the energy flow is given in FIGS. 4a to 4c.

As apparent from the above description, the present invention provides a high power laser diode driver utilizing a monolithic, optically activated semiconductor device with $p^+$-n-i-p-$n^+$ switch structure. In accordance with the present invention, the monolithic semiconductor device is consisted of an energy storage medium for storing electrical energy therein and an optically activated semiconductor switch for converting the capacitively charged electrostatic energy into the high current impulse while being turned on by the laser light. With such a structure, the monolithic, optically activated semiconductor device can generate high amplitude current pulses.

The monolithic device provides gaining mechanism as well as minimizing adverse circuit effects such as stray inductance and capacitance. Further, switch turn-on with a triggering optical pulse from low (or medium) power laser diode achieves very extremely fast rise and fall times. Hence, the proposed driver is able to generate high power laser output pulses with fast rise time and fast fall time at high PRF.

Although the preferred embodiments of the invention have been disclosed for illustrative purposes, those skilled in the art will appreciate that various additions and substitutions are possible, without departing from the scope and spirit of the invention as disclosed in the accompanying claims.

What is claimed is:

1. A laser diode driver for storing energy and for activating by an optical signal, said laser diode driver comprising:

capacitor means for storing the energy;

a semiconductor means for switching by the optical signal;

a single substrate;

the capacitor means and the semiconductor switch means integrated into the single substrate; and wherein the semiconductor switch means has a $p^+$-n-i-p-$n^+$ structure.

* * * * *